(12) United States Patent
Tanaka et al.

(10) Patent No.: US 12,510,587 B2
(45) Date of Patent: Dec. 30, 2025

(54) SEMICONDUCTOR DEVICE AND INSPECTION METHOD FOR SEMICONDUCTOR DEVICE

(71) Applicant: RENESAS ELECTRONICS CORPORATION, Tokyo (JP)

(72) Inventors: Yoshiaki Tanaka, Tokyo (JP); Kouji Nakajima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 195 days.

(21) Appl. No.: 18/470,820

(22) Filed: Sep. 20, 2023

(65) Prior Publication Data

US 2024/0133944 A1  Apr. 25, 2024
US 2024/0230751 A9  Jul. 11, 2024

(30) Foreign Application Priority Data

Oct. 25, 2022 (JP) ................................ 2022-170435

(51) Int. Cl.
*G01R 31/28* (2006.01)
(52) U.S. Cl.
CPC ............................... *G01R 31/2853* (2013.01)
(58) Field of Classification Search
CPC .................................................. G01R 31/2853
USPC .................................. 324/762.01, 537, 500
See application file for complete search history.

(56) References Cited

U.S. PATENT DOCUMENTS

| 8,310,049 B2 * | 11/2012 | Andou .............. H01L 23/49513 |
| | | 257/E21.511 |
| 10,032,736 B2 * | 7/2018 | Miura ................. H01L 23/4824 |
| 10,910,337 B2 * | 2/2021 | Okunishi .......... H01L 23/49524 |
| 2001/0026168 A1 * | 10/2001 | Tamaru ............ G01R 31/31905 |
| | | 324/756.04 |
| 2018/0034404 A1 * | 2/2018 | Takemura ............... H02P 27/06 |
| 2025/0253267 A1 * | 8/2025 | Jhan ........................ H01L 22/34 |

FOREIGN PATENT DOCUMENTS

JP          2020-150116 A       9/2020

* cited by examiner

*Primary Examiner* — Giovanni Astacio-Oquendo
(74) *Attorney, Agent, or Firm* — Rimon P.C.

(57) ABSTRACT

A semiconductor device making it easy to detect disconnection in source wires and achieving a reduction in resistance and an inspection method for the semiconductor device are provided. A semiconductor device according to the present embodiment includes: a lead frame; a semiconductor chip on the lead frame; a source pad provided in the semiconductor chip; a plurality of source wires connected to the source pad; a disconnection detection wire connected to the source pad; source terminals connected to the plurality of source wires; and a disconnection detection terminal connected to the disconnection detection wire. One end of the disconnection detection wire is positioned in vicinity of a corner of the source pad closer to the disconnection detection terminal side.

5 Claims, 5 Drawing Sheets

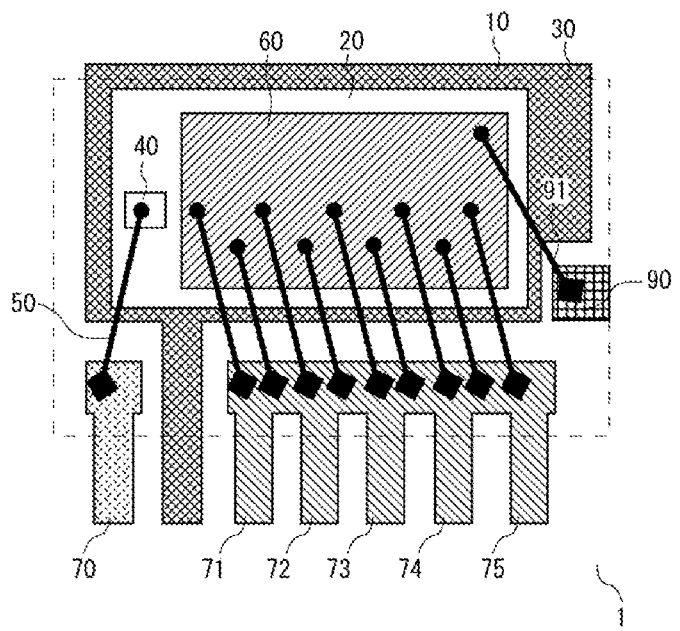
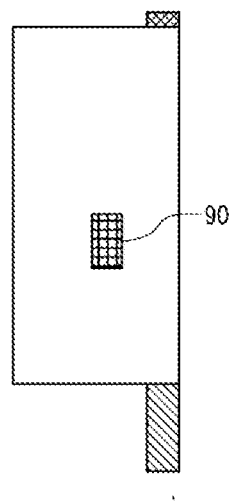
FIG. 1A
FIG. 1B
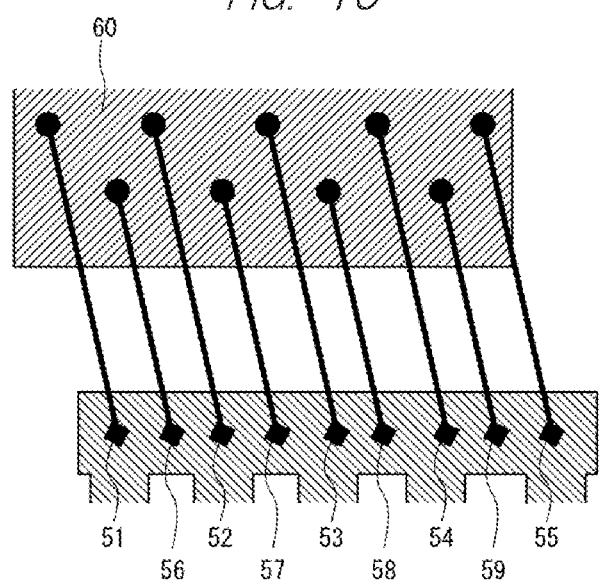
FIG. 1C

SEMICONDUCTOR DEVICE AND INSPECTION METHOD FOR SEMICONDUCTOR DEVICE

CROSS-REFERENCE TO RELATED APPLICATION

The disclosure of Japanese Patent Application No. 2022-170435 filed on Oct. 25, 2022, including the specification, drawings and abstract is incorporated herein by reference in its entirety.

BACKGROUND

The present disclosure relates to a semiconductor device and an inspection method for the semiconductor device.

There is disclosed a technique listed below.

[Patent Document 1] Japanese Unexamined Patent Application Publication No. 2020-150116

In a power semiconductor that handles a high voltage and a large current, suppressions of heat generation and power loss are problems always to be solved. In order to suppress heat generation and power loss, it is desirable to achieve a reduction in resistance of a power semiconductor product.

For example, the Patent Document 1 discloses that the number of connectable source wires is increased to promote reduction in resistance of the power semiconductor product by dividing a source electrode of a semiconductor chip into a plurality of regions.

In addition to a request to achieve the reduction in resistance, a power semiconductor has a problem that a malfunction such as disconnection in a wire or non-adhesion between an electrode surface of a semiconductor chip and the wire easily occurs because of handling large power.

For example, the Patent Document 1 discloses a method of manufacturing a semiconductor device that includes a step of detecting disconnection in source wires by applying a voltage to a plurality of source terminals adjacent to each other via a high-resistance connection portion and measuring a resistance value between the source terminals.

An example of a semiconductor device mounted on a package disclosed in the Patent Document 1 is illustrated in FIG. 5. A semiconductor device 100 includes a lead frame 110, a semiconductor chip 120, a sealing member 130, a gate pad 140, a gate wire 150, source wires 151 to 155, a source pad 160, a gate terminal 170, source terminals 171 to 175, and high-resistance connection portions 181 to 184.

The semiconductor chip 120 is mounted on the lead frame 110. The source pad 160 is connected to the source terminals 171 to 175, respectively, via the source wires 151 to 155. The high resistance connection portions 181 to 184 are positioned among the source terminals 171 to 175. That is, the source terminal is coupled to the adjacent source terminal via the high resistance connection portion.

Then, a step of detecting disconnection in source wires will be described. The semiconductor device 100 has a configuration of detecting the disconnection between the source wire 151 and the source wire 152 by flowing a current from the source terminal 171 to the source terminal 172 to measure a voltage value between the source terminals. Even in the source wires 153, 154, and 155, the disconnection can be also detected by flowing a current from the source terminal 171 to each of the source terminals 173 to 175.

However, the step of detecting the disconnection in the source wires 151 to 155 needs the measurement at each of the source terminals, and therefore, the step needs to be performed at least four times as described above. Further, in each inspection, the source terminal 171 is used as one of terminals between which the current is caused to flow. Accordingly, it is impossible to distinguish which one of the detection in the source wire 151 and the detection in the source wires 152 to 155 is the detection of disconnection.

Further, the above-described high-resistance connection portion needs to have a sufficiently larger resistance than that of the source terminals in order to increase the accuracies of measurement of the resistance value and the detection of disconnection. The Patent Document 1 discloses that a high-resistance is ensured by setting the high resistance connection portion to be a narrow site, i.e., to have a small area. However, in this case, the source terminals and the source wires are in a one-to-one connection relationship, and the source wires that are more than the source terminals of the semiconductor chip cannot be provided.

Thus, it can be said that there is a room for further study to make it easy to detect the disconnection in source wires and achieve the reduction in resistance of the power semiconductor product. Other problems and novel characteristics will be apparent from the description of the present specification and the accompanying drawings.

SUMMARY

A semiconductor device according to the present disclosure includes: a lead frame; a semiconductor chip on the lead frame; a source pad provided in the semiconductor chip; a plurality of source wires connected to the source pad; a disconnection detection wire connected to the source pad; a source terminal connected to the plurality of source wires; and a disconnection detection terminal connected to the disconnection detection wire, and one end of the disconnection detection wire is positioned in vicinity of a corner of the source pad closer to the disconnection detection terminal side.

An inspection method for a semiconductor device according to the present disclosure is an inspection method for a semiconductor device including a plurality of source wires, and the method is for detecting disconnection in the plurality of source wires by causing a current to flow between a source terminal connected to respective one ends of the plurality of source wires and a disconnection detection terminal and measuring a voltage, and comparing a measured voltage value and a reference voltage value in a case without occurrence of disconnection in the plurality of source wires.

According to the present disclosure, a semiconductor device making it easy to detect disconnection in source wires and achieving a reduction in resistance and an inspection method for the semiconductor device can be provided.

BRIEF DESCRIPTIONS OF THE DRAWINGS

FIG. 1A is a configuration diagram of a semiconductor device according to a first embodiment.

FIG. 1B is a configuration diagram of a semiconductor device according to a first embodiment.

FIG. 1C is a configuration diagram of a semiconductor device according to a first embodiment.

DETAILED DESCRIPTION

First Embodiment

Figure 2A:
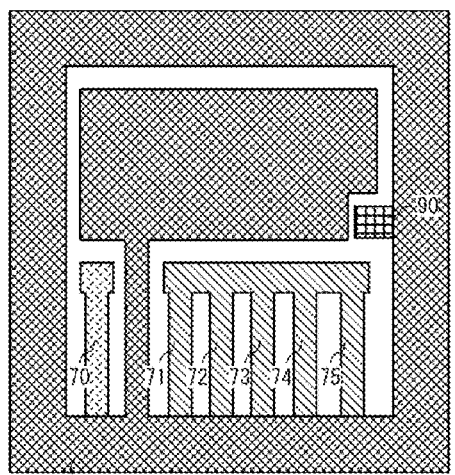
FIG. 2A is a diagram for explaining a step for manufacturing the semiconductor device according to the first embodiment.

An embodiment of the present disclosure will be described below with reference to the drawings. In the present embodiment, a "connected" state includes an "electrically connected" case.

FIG. 1A is a top view of a semiconductor device 1 mounted on a package according to the present embodiment. The semiconductor device 1 includes a lead frame 10, a semiconductor chip 20, a sealing member 30, a gate pad 40, a gate wire 50, source wires 51 to 59, a source pad 60, a gate terminal 70, source terminals 71 to 75, a disconnection detection terminal 90, and a disconnection detection wire 91. For convenience of a space, reference numerals of the source wires 51 to 59 are omitted in FIG. 1A. The source wires 51 to 59 are described in detail in FIG. 1C.

FIG. 1B is a side view of the semiconductor device 1 mounted on the package. As illustrated in FIG. 1B, the disconnection detection terminal 90 is exposed to a side surface of the package 2, and is used to detect the disconnection in the semiconductor device 1.

FIG. 1C is a diagram illustrating a region of arrangement of the source wires 51 to 59 to be enlarged. Each of the source wires 51 to 59 plays a role of electrically connecting the source pad 60 and each of the source terminals 71 to 75. In the present embodiment, note that a semiconductor device including five source terminals is illustrated as one example. However, the number of source terminals is not limited to this example.

The source terminals 71 to 75 are coupled to one another in a region of arrangement of respective one ends of the source wires 51 to 59. In other words, the semiconductor device has a configuration in which five source terminals extend from one large connection portion connected to a plurality of source wires. Alternatively, it can also be said that the semiconductor device has a configuration in which one source wire is connected to a connection portion of a low resistance arranged in contact between two adjacent source terminals.

In explanation in view of the above-described configuration, the source wires 51 to 55 according to the present embodiment are respectively connected to the source terminals 71 to 75, and each of the source wires 56 to 59 is connected between the two adjacent source terminals among the source terminals 71 to 75. For example, the one end of the source wire 56 is provided between the source terminal 71 and the source terminal 72, and the one end of the source wire 59 is provided between the source terminal 74 and the source terminal 75.

Because of such a configuration, (2m−1) source wires are provided for "m" source terminals (m>1). Accordingly, the resistance of the semiconductor device can be made lower than that of a semiconductor device in which source terminals and source wires are one-to-one connected to each other.

Then, arrangement of the respective other ends of the source wires 51 to 59 provided in the source pad 60 will be described. As illustrated in FIGS. 1A and 1C, the respective other ends of the source wires 56 to 59 are provided closer to the source terminal side than the respective other ends of the source wires 51 to 55. Therefore, distances between one end of the disconnection detection wire 91 and the other ends of all the source wires 51 to 59 provided in the source pad 60 are different from one another. Because of such a configuration, the disconnection in the source wires can be performed by a single inspection as described later.

The one end of the disconnection detection wire 91 provided in the source pad 60 is preferably provided at an end of the source pad 60, i.e., in the vicinity of a corner of the source pad 60 closer to the disconnection detection terminal 90 side. Because of such a configuration, it is easy to make difference among the distances between the respective other ends of the source wires and the one end of the disconnection detection wire 91.

A method for manufacturing the semiconductor device 1 according to the present embodiment will be described with reference to FIG. 2. First, a gate terminal 70, source terminals 71 to 75, and a disconnection detection terminal 90 are formed in a lead frame 10 (see FIG. 2A). The lead frame 10 is made of a conductor such as a metal material. The same applies to the gate terminal 70, the source terminals 71 to 75, and the disconnection detection terminal 90.

Figure 2B:
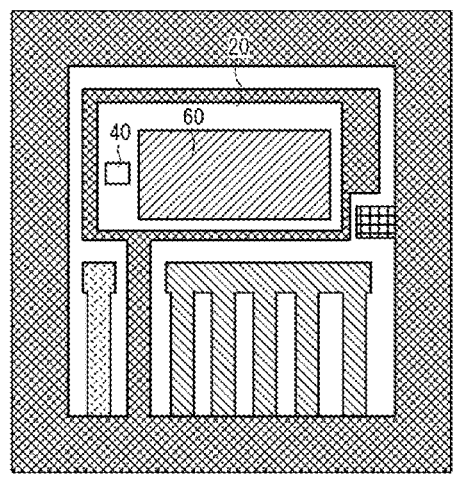
FIG. 2B is a diagram for explaining a step for manufacturing the semiconductor device according to the first embodiment.

Then, a bonding member (not illustrated) is applied to the lead frame 10 to be bonded with a semiconductor chip 20 provided with a gate pad 40 and a source pad 60 (see FIG. 2B). An adhesive, a metal paste, a solder and others are exemplified as examples of a material for the bonding member. The gate pad 40 and the source pad 60 are formed by introducing an impurity into a semiconductor substrate (wafer) to be the semiconductor chip 20 and diffusing the impurity to provide a low-resistance region or using a method such as plating to provide a conductor such as a metal material.

Figure 2C:
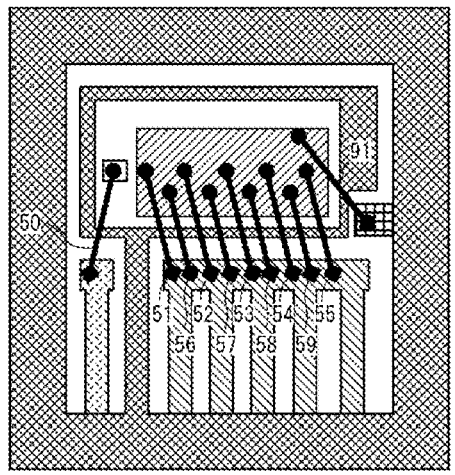
FIG. 2C is a diagram for explaining a step for manufacturing the semiconductor device according to the first embodiment.

Then, a gate wire 50, source wires 51 to 59, and a disconnection detection wire 91 are formed (see FIG. 2C). As a result, the gate pad 40 and the gate terminal 70 are electrically connected to each other by the gate wire 50, and the source pad 60 and the source terminals 71 to 75 are electrically connected to each other by the source wires 51 to 59. The source pad 60 and the disconnection detection terminal 90 are electrically connected to each other by the disconnection detection wire 91.

Figure 2D:
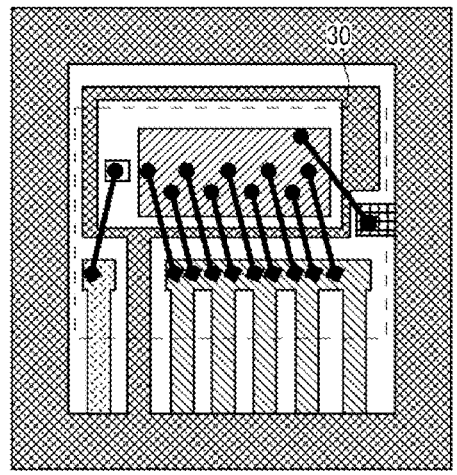
FIG. 2D is a diagram for explaining a step for manufacturing the semiconductor device according to the first embodiment.
Figure 2E:
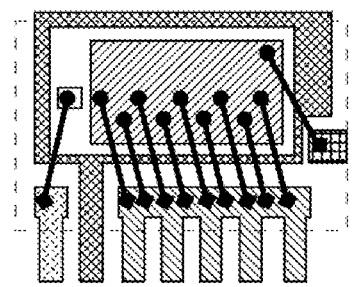
FIG. 2E is a diagram for explaining a step for manufacturing the semiconductor device according to the first embodiment.

Then, a sealing member 30 containing resin or the like is formed on the lead frame 10 (see FIG. 2D). The sealing member 30 functions as the package 2 illustrated in FIG. 1B. Finally, the lead frame 10 is cut into a predetermined shape to obtain the semiconductor device 1 according to the present embodiment (see FIG. 2E).

Figure 3A:
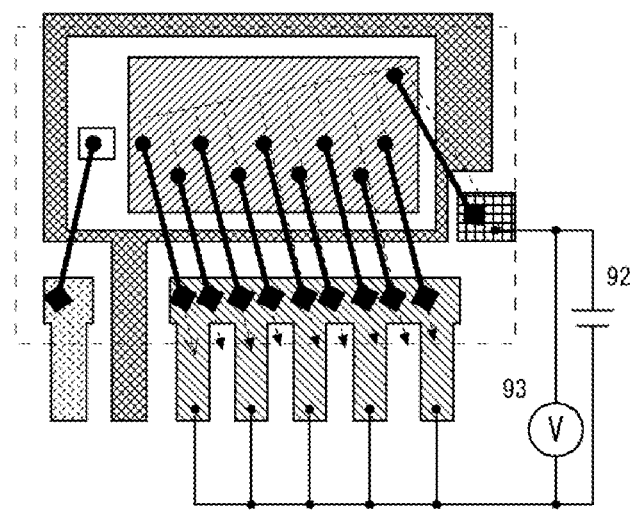
FIG. 3A is a diagram for explaining an inspection method for the semiconductor device according to the first embodiment.

A step of detecting the disconnection in source wires in the semiconductor device 1 according to the present embodiment will be described with reference to FIG. 3. FIG. 3A illustrates a state where a power supply 92 and a voltmeter 93 are connected between the source terminals 71 to 75 and the disconnection detection terminal 90 in the semiconductor device 1 illustrated in FIG. 2E.

A constant current is caused to flow from the disconnection detection terminal 90 to each of the source terminals 71 to 75 by using the power supply 92, and a voltage between the source terminals 71 to 75 and the disconnection detection terminal 90 is measured by the voltmeter 93. When disconnection occurs in the source wires, a resistance between the source terminals 71 to 75 and the disconnection detection terminal 90 increases by an amount of the disconnection. Therefore, a higher voltage value is measured than that in a case without the occurrence of the disconnection in the source wires. Thus, the disconnection in the source wires can be detected since the measured voltage value is compared with the voltage value in the case without the occurrence of the disconnection, i.e., with a reference voltage value.

Figure 3B:
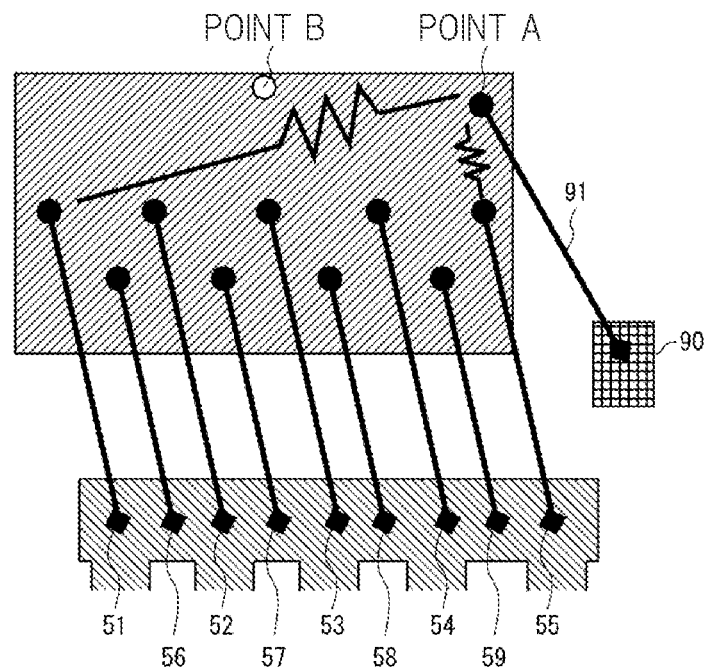
FIG. 3B is a diagram for explaining an inspection method for the semiconductor device according to the first embodiment.

Then, an effect produced by providing one end of the disconnection detection wire 91 provided in the source pad 60 at a point A that is the vicinity of a corner closer to the disconnection detection terminal 90 side will be described with reference to FIG. 3B.

The source wire at a position closer to the one end of the disconnection detection wire 91 has a small resistance component of the source pad 60, and the source wire at a position farther thereto has a large resistance component of the source pad 60. Therefore, the voltage value measured by the voltmeter 93 varies depending on a distance from the one end of the disconnection detection wire 91, and thus, the disconnected source wire can be estimated.

A simulation result of calculation of the voltage value between the disconnection detection terminal 90 and each of the source terminals 71 to 75 (hereinafter referred to as "between terminals") is shown in Table 1. In the case without the disconnected source wire, the resistance between the terminals is the lowest, and thus, the voltage value is also low. On the other hand, in the case with the disconnected source wire, the resistance between the terminals is higher than that in the case without the disconnection, and thus, the voltage value also increases by an amount of the disconnection.

TABLE 1

| Disconnected wire | None | Source wire 55 | Source wire 58 | Source wire 51 |
|---|---|---|---|---|
| Voltage value between terminals (mV) | 90.0 | 99.0 | 93.6 | 91.5 |

As an example, when the source wire 55 closest to the one end of the disconnection detection wire 91 is disconnected, i.e., in the case with the occurrence of the disconnection between the terminals in which a current most easily flows, the voltage value between the terminals is higher by an amount of the disconnection than that in the case with the other disconnected source wire. In contrast, when the source wire 51 farthest from the one end of the disconnection detection wire 91 is disconnected, i.e., in the case with the occurrence of the disconnection between the terminals in which a current is most different to flow, the voltage value between the terminals increases, but the degree of the increase is small.

On the other hand, when the one end of the disconnection detection wire 91 is provided at a point B of the source pad 60 in the vicinity of the center on the opposite side to the side having the source terminals 71 to 75 provided, source wires exist at the same distance from the one end of the disconnection detection wire 91. For example, the source wire 51 and the source wire 55 are at substantially the same distance from the point B. At this time, when the disconnection occurs in either one of the source wire 51 and the source wire 55, respective measured voltage values are substantially the same, and thus, it is difficult to estimate the disconnected source wire.

Therefore, when the one end of the disconnection detection wire 91 is provided at the point A in the vicinity of the corner closer to the disconnection detection terminal 90 side, the disconnection in the source wires can be detected by a single inspection.

As illustrated in FIG. 1B, when an end of the disconnection detection terminal 90 is aligned with an end of the sealing member 30, i.e., is provided to be exposed from a side surface of the package 2, the disconnection detection can be inspected in any stage of the manufacturing processes. In addition, the disconnection detection terminal 90 is exposed to only the side surface of the package, and is not exposed to a rear surface of the package, and thus, it is unnecessary to consider influence produced when the semiconductor device 1 is mounted on the customer side.

Thus, a semiconductor device making it easy to detect the disconnection in source wires and achieving the reduction in resistance and an inspection method for the semiconductor device can be provided.

Second Embodiment

In the present embodiment, a semiconductor device obtained by developing the first embodiment will be described. The same components as those in the first embodiment may be omitted to avoid repeated description thereof.

Figure 4:
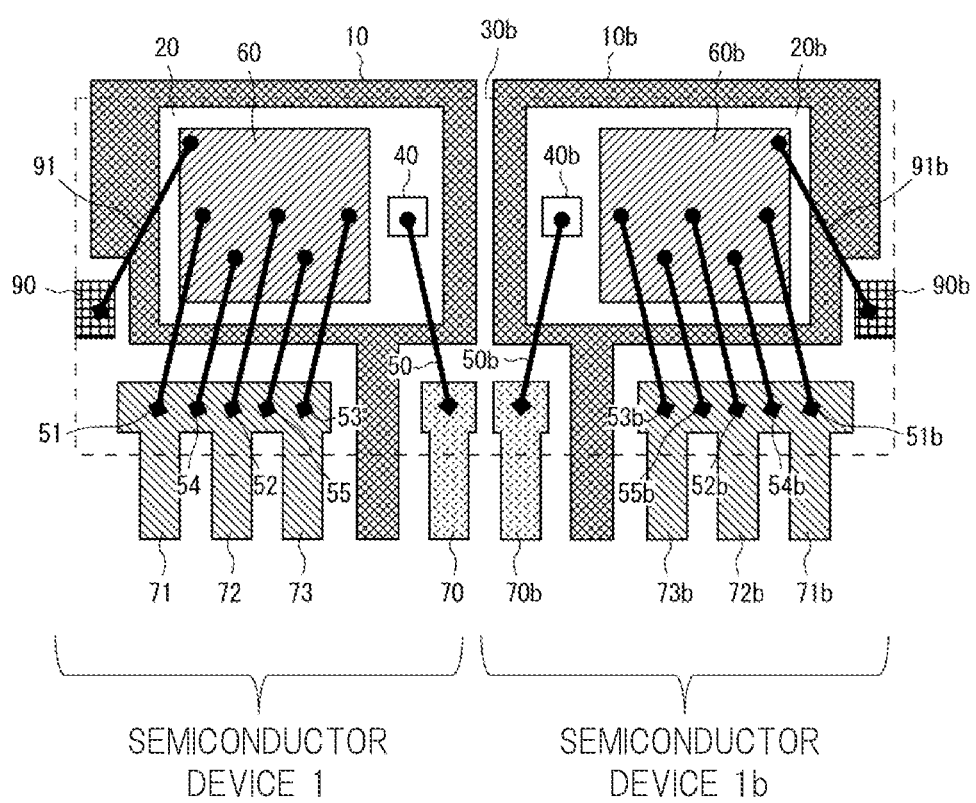
FIG. 4 is a configuration diagram of a semiconductor device according to a second embodiment.
Figure 5:
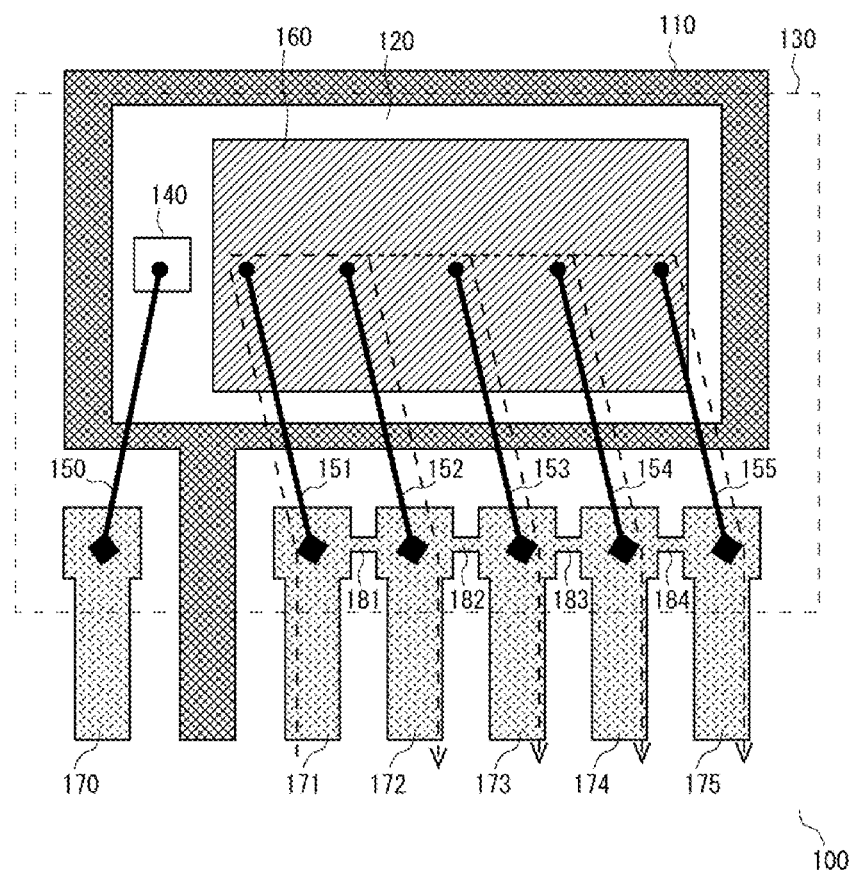
FIG. 5 is a configuration diagram illustrating an example of the semiconductor device.

FIG. 4 is a top view of a semiconductor device at the time of dual chip mounting. The semiconductor device according to the present embodiment includes a semiconductor device 1 and a semiconductor device 1b. The semiconductor device 1b has a similar configuration to that of the semiconductor device 1, and includes a lead frame 10b, a semiconductor chip 20b, a gate pad 40b, a gate wire 50b, source wires 51b to 55b, a source pad 60b, a gate terminal 70b, source terminals 71b to 73b, a disconnection detection terminal 90b, and a disconnection detection wire 91b. The semiconductor device 1 and the semiconductor device 1b are sealed by one sealing member 30b.

Although the semiconductor device 1 and the semiconductor device 1b illustrated in FIG. 4 each include three source terminals, the number of source terminals is not limited to this.

Because of such a configuration, a semiconductor device making it easy to detect disconnection in source wires and achieving the reduction in resistance even at the time of dual chip mounting and an inspection method for the semiconductor device can be provided.

The present invention is not limited to the above-described embodiments, and the modification of the invention can be appropriately made within the scope of the invention.

In the foregoing, the invention made by the inventors of the present application has been concretely described on the basis of the embodiments. However, it is needless to say that the present invention is not limited to the foregoing embodiments, and various modifications can be made within the scope of the present invention.

What is claimed is:

1. A semiconductor device comprising:
   a lead frame;
   a semiconductor chip on the lead frame;
   a source pad provided in the semiconductor chip;
   a plurality of source wires connected to the source pad;
   a disconnection detection wire connected to the source pad;
   a source terminal connected to the plurality of source wires; and
   a disconnection detection terminal connected to the disconnection detection wire,
   wherein one end of the disconnection detection wire is positioned in vicinity of a corner of the source pad closer to the disconnection detection terminal side.

2. The semiconductor device according to claim 1, wherein distances between one ends of the plurality of source wires and the one end of the disconnection detection wire are different from one another in the source pad.

3. The semiconductor device according to claim 1, wherein the source terminal includes a connection portion, and the plurality of source wires are connected to the source terminal in the connection portion.

4. The semiconductor device according to claim 1, further comprising:
   a sealing member sealing the lead frame,
   wherein the disconnection detection terminal is exposed from a side surface of the sealing member.

5. The semiconductor device according to claim 4, further comprising:
   a second lead frame;
   a second semiconductor chip;
   a second source pad;
   a plurality of second source wires;
   a second disconnection detection wire;
   a second source terminal; and
   a second disconnection detection terminal,
   wherein the lead frame and the second lead frame are sealed by the sealing member, and
   wherein the disconnection detection terminal and the second disconnection detection terminal are respectively exposed from side surfaces of the sealing member.

* * * * *